(12) United States Patent
Lin

(10) Patent No.: US 6,982,134 B2
(45) Date of Patent: Jan. 3, 2006

(54) MULTIPLE STEPPED APERTURE REPAIR OF TRANSPARENT PHOTOMASK SUBSTRATES

(75) Inventor: Cheng-Ming Lin, Hsin-Chu (TW)

(73) Assignee: Taiwan Semiconductor Manufacturing, Co., LTD

( * ) Notice: Subject to any disclaimer, the term of this patent is extended or adjusted under 35 U.S.C. 154(b) by 241 days.

(21) Appl. No.: 10/402,196

(22) Filed: Mar. 28, 2003

(65) Prior Publication Data

US 2004/0191642 A1  Sep. 30, 2004

(51) Int. Cl.
*G01F 9/00* (2006.01)
*G03C 5/00* (2006.01)
(52) U.S. Cl. .......................... 430/5; 430/394
(58) Field of Classification Search .................... 430/5, 430/322–324, 394
See application file for complete search history.

(56) References Cited

U.S. PATENT DOCUMENTS

| 5,547,788 | A  | * | 8/1996  | Han et al. ....................... 430/5 |
| 5,639,699 | A  |   | 6/1997  | Nakamura et al. .......... 437/238 |
| 6,165,649 | A  |   | 12/2000 | Grenon et al. .................. 430/5 |
| 6,329,106 | B1 |   | 12/2001 | Bae et al. ....................... 430/5 |
| 6,340,543 | B1 | * | 1/2002  | Nagamura et al. ............. 430/5 |
| 6,436,587 | B1 | * | 8/2002  | Ulrich et al. ................... 430/5 |

* cited by examiner

*Primary Examiner*—S. Rosasco
(74) *Attorney, Agent, or Firm*—Tung & Associates

(57) ABSTRACT

A method for repairing a transparent photomask substrate and a transparent photomask substrate repaired in accord with the method employ when eliminating a defect within a transparent photomask substrate a multi-stepped aperture having a series of progressive steps which separate a series of progressive plateaus. Each plateau has a plateau width and a step height such as to enhance transparent photomask substrate transmittance within the multi-stepped aperture. The method provides for efficient repair of a transparent photomask substrate.

19 Claims, 2 Drawing Sheets

US 6,982,134 B2

MULTIPLE STEPPED APERTURE REPAIR OF TRANSPARENT PHOTOMASK SUBSTRATES

BACKGROUND OF THE INVENTION

1. Field of the Invention

The present invention relates generally to repair of transparent photomask substrates. More particularly, the present invention relates to efficient repair of transparent photomask substrates.

2. Description of the Related Art

Photomasks are an essential element for use in pattern transfer when fabricating microelectronic products. Photomasks typically comprise a transparent photomask substrate having formed thereupon opaque regions which serve as positive tone regions when photoexposing positive photoresist materials and as negative tone regions when photoexposing negative photoresist materials.

The reduction or elimination of photomask defects, both photomask pattern defects and photomask substrate defects, is generally of considerable importance within microelectronic product fabrication insofar as photomask defects are often in turn directly replicated into microelectronic product defects when fabricating microelectronic products.

The present invention is thus directed towards the repair of photomask defects.

Various photomask repair methods have been disclosed in the photomask fabrication art.

Included but not limiting among the photomask repair methods are those disclosed in: (1) Nakamura et al., in U.S. Pat. No. 5,639,699 (a deposition and etchback method for repairing protrusion defects and void defects within transparent photomask substrates); (2) Grenon et al., in U.S. Pat. No. 6,165,649 (a masking method for repairing opaque pattern defects within photomasks); and (3) Bae et al., in U.S. Pat. No. 6,329,106 (a two step focused ion beam and laser bean method for repairing bridging defects within phase shift photomasks).

The teachings of each of the foregoing references are incorporated herein fully by reference.

Desirable in the microelectronic product fabrication art are additional methods for repairing photomasks.

It is towards the foregoing object that the present invention is directed.

SUMMARY OF THE INVENTION

A first object of the invention is to provide a method for repairing a photomask.

A second object of the invention is to provide a method in accord with the first object of the invention, wherein the photomask is efficiently repaired.

In accord with the objects of the invention, the invention provides a method for repairing a transparent photomask substrate, and a transparent photomask substrate repaired in accord with the method.

The method first provides a transparent photomask substrate having a defect formed within the transparent photomask substrate. The method also provides for forming into the transparent photomask substrate a multi-stepped aperture which eliminates the defect. Within the method, the multi-stepped aperture has a series of progressive steps which separate a series of progressive plateaus, each plateau having a plateau width and step height such as to enhance transparent photomask substrate transmittance within the multi-stepped aperture.

A particularly useful embodiment of the invention provides a multi-stepped aperture having four progressive steps which provide five progressive plateaus each of elevation such as to provide a progressive series of 45 degree phase changes of transmitted light between successive plateaus, such as a void defect with 180 degree phase change need have the series of five progressive plateaus.

The method of the invention contemplates a repaired photomask repaired in accord with the method of the invention.

The invention provides a method for repairing a photomask, and a repaired photomask repaired in accord with the method, wherein the repaired photomask is efficiently repaired.

The invention realizes the foregoing object by eliminating a defect within a transparent photomask substrate and replacing the defect with a multi-stepped aperture. Within the invention, the multi-stepped aperture has a series of progressive steps which separates a series of progressive plateaus, where each plateau has a plateau width and step height such as to enhance transparent photomask substrate transmittance within the multi-stepped aperture (in particular in comparison with transparent photomask substrate transmittance through the defect which is eliminated by the multi-stepped aperture).

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for repairing a photomask, and a repaired photomask repaired in accord with the method, herein the repaired photomask is efficiently repaired.

The invention realizes the foregoing objects by eliminating a defect within a transparent photomask substrate and replacing the defect with a stepped aperture. Within the invention, the stepped aperture has a series of progressive steps which separate a series of progressive plateaus, where each plateau has a plateau width and step height such as to enhance transparent photomask substrate transmittance within the stepped aperture.

Figure 1:
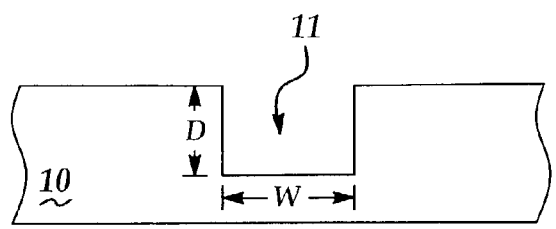
FIG. 1 shows a schematic cross-sectional diagram of a transparent photomask substrate having formed therein an ideal void defect.

FIG. 1 shows a schematic cross-sectional diagram of a transparent photomask substrate having formed therein an ideal void defect which may be repaired in accord with the present invention.

FIG. 1 shows a transparent photomask substrate 10 having formed therein the ideal void defect 11 which is illustrated as a straight sided and flat bottomed aperture. As is illustrated in FIG. 1, the ideal void defect 11 which is illustrated as the straight sided and flat bottomed aperture has an aperture depth D within the transparent photomask substrate 10 and an aperture width W within the transparent photomask substrate 10.

Within the invention, the transparent photomask substrate 10 will typically be formed of a transparent quartz material, although the transparent photomask substrate 10 may also be formed of other suitable materials which are optically transparent with respect to a dose of actinic radiation which is employed for photoexposing a blanket photoresist layer when employing a photomask which comprises the transparent photomask substrate 10. Typically, the transparent photomask substrate 10 is formed to a thickness of from about 1 to about 10 millimeters.

Figure 2:
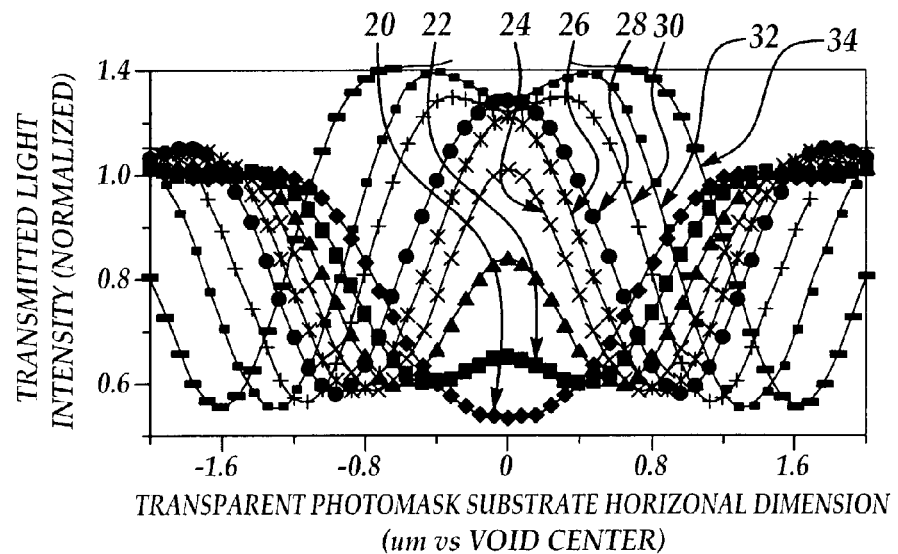
FIG. 2 shows a graph of Transmitted Light Intensity versus Transparent Substrate Horizontal Dimension for the transparent photomask substrate having formed therein the ideal void defect in accord with FIG. 1.

FIG. 2 shows a graph of Transmitted Light Intensity versus Transparent Photomask Substrate Horizontal Dimension for the transparent photomask substrate 10 having formed therein the ideal void defect 11 in accord with the schematic cross-sectional diagram of FIG. 1. Within FIG. 2, the data point curves which correspond with reference numerals 20, 22, 24, 26, 28, 30, 32 and 34 correspond with different aperture widths W of the ideal void defect 11. The different aperture widths correspond, respectively, with 0.8, 1.0, 1.2. 1.4, 1.8, 2.2, 2.6 and 3.2 microns. Within FIG. 2, a single aperture depth D is employed such as to provide a 180 degree phase change for a dose of actinic radiation passing through the transparent photomask substrate 10 at areas other than the ideal void defect 11, in comparison with the ideal void defect 11.

As is illustrated by the data point curve 20 which correlates with the ideal void defect 11 of 0.8 microns aperture width W, transmitted light intensity has a single trough of minimum about 5 percent normalized, while the remaining data point curves which correlate with the ideal void defect 11 of 1.0 to 3.2 microns aperture width W have bimodal troughs of transmitted light intensity with a minimum of about 10 to about 20 percent normalized. The invention is directed towards increasing minimum transmitted light intensity in comparison with the minimum transmitted light intensities illustrated in FIG. 2, for an actual defect within a transparent photomask substrate.

Figure 3:
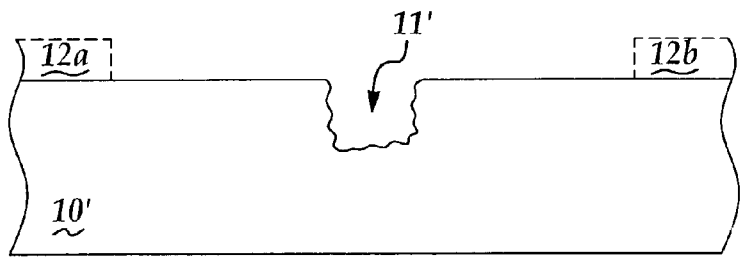
FIG. 3 and FIG. 4 show a pair of schematic cross-sectional diagrams illustrating the results of progressive stages in repairing a transparent photomask substrate having formed therein an actual void defect in accord with the present invention.
Figure 4:
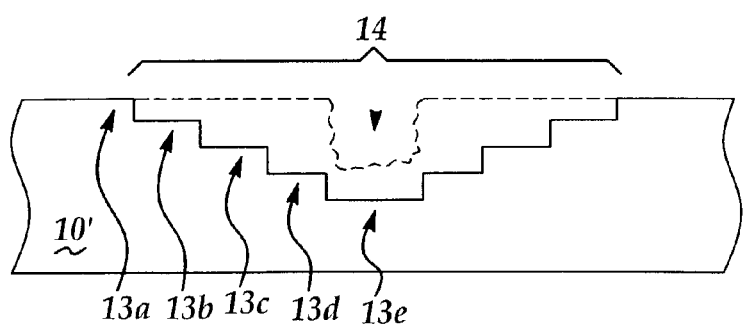

FIG. 3 and FIG. 4 show a pair of schematic cross-sectional diagrams illustrating the results of progressive stages in repairing a transparent photomask substrate having formed therein an actual void defect in accord with the present invention.

While FIG. 3 illustrates a transparent photomask substrate having formed therein an actual void defect which may be repaired in accord with the invention, the invention may in a broader application be employed for repairing within transparent photomask substrates defects including but not limited to protrusion defects and void defects.

FIG. 3 shows a schematic cross-sectional diagram of a transparent photomask substrate 10' having formed therein an actual void defect 11' and having formed thereupon an optional pair of patterned masking layers 12a and 12b.

Within FIG. 3, the transparent photomask substrate 10' is otherwise analogous, equivalent or identical to the transparent photomask substrate 10 as illustrated in FIG. 1. In addition, within FIG. 3 the actual void defect 11' is otherwise analogous or equivalent to the ideal void defect 11 as illustrated in FIG. 1, but the actual void defect 11' will typically have irregular sidewalls and an irregular bottom rather than straight sided sidewalls and a flat bottom in accord with the ideal void defect 11 as illustrated in FIG. 1. Finally, the pair of optional patterned masking layers 12a and 12b is illustrated with the intention that the invention may be employed for repairing blank transparent photomask substrates as well as fabricated transparent photomask substrates (i.e., completed photomasks). The fabricated transparent photomask substrates which may be repaired within the context of the invention may include, but are not limited to, conventional photomasks (as generally illustrated in FIG. 3) as well as phase shift photomasks (which employ additional phase shifting layers).

FIG. 4 shows a schematic cross-sectional diagram illustrating the results of further processing of the transparent photomask substrate 10' of FIG. 3.

FIG. 4 shows the results of forming into the transparent photomask substrate 10' as illustrated in FIG. 3 a multi-stepped aperture 14 which eliminates the actual void defect 11' and thus forms from the transparent photomask substrate 10' a repaired transparent photomask substrate 10". Within the invention in general, a multi-stepped aperture comprises a series of n steps defining and separating a series of n+1 plateaus (where n equals at least two, more preferably at least three and yet more preferably at least four (as illustrated in FIG. 4 to provide the series of 5 plateaus 13a, 13b, 13c, 13d and 13e)). Within the invention, the series of n steps and n+1 plateaus fulfills in general the desirable condition of enhancing and preferably maximizing transmitted light intensity within the repaired transparent photomask substrate 10" at the location of the multi-stepped aperture 14 (in comparison with transmitted light intensity at the location of the actual void defect 11' within the transparent photomask substrate 10').

Within the invention, the multi-stepped aperture 14 which eliminates the void defect 11' may be formed employing methods including but not limited to successive photolithographic masking and etch methods, as well as direct ion beam activated etch methods. Either of the foregoing methods may employ a fluorine containing etchant gas for etching the transparent photomask substrate 10' when formed of a quartz or silicon oxide containing transparent material.

Figure 5:
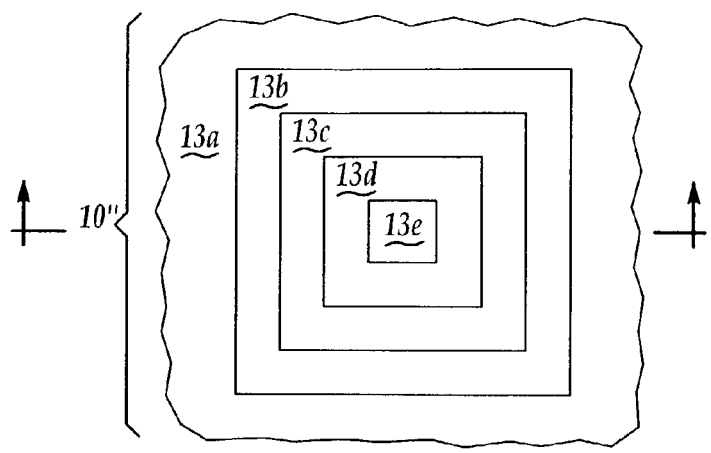
FIG. 5 shows a schematic plan view diagram corresponding with the schematic cross-sectional diagram of FIG. 4.

FIG. 5 shows a schematic plan view diagram of the transparent photomask substrate 12' as illustrated in FIG. 4.

Within FIG. 5, the series of plateaus 13a, 13b, 13c, 13d and 13e is illustrated as a series of annular plateaus successively enclosing increasingly smaller square areas. The invention is not however limited to plateaus formed enclosing square areas, but plateaus enclosing other regular or irregular geometric forms may also be employed within the invention.

Figure 6:
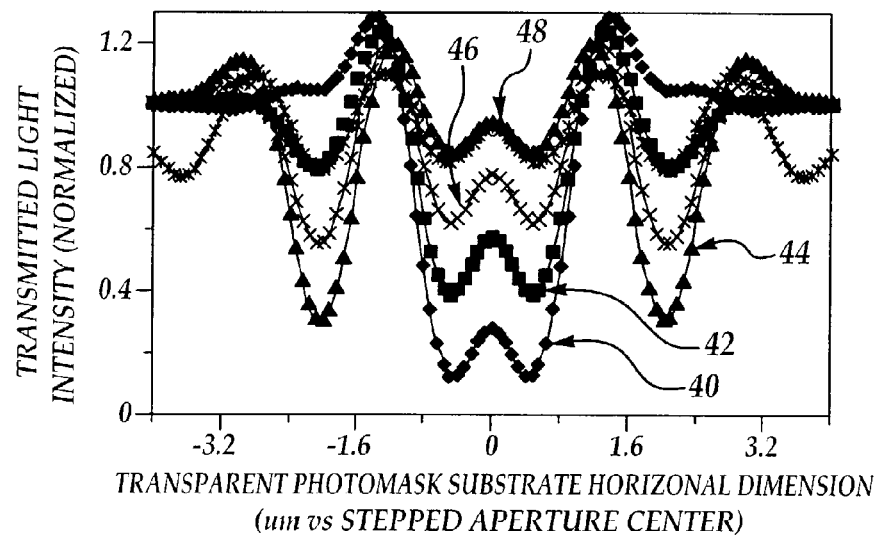
FIG. 6 and FIG. 7 show a pair of graphs of Transmitted Light Intensity versus Transparent Substrate Horizontal Dimension for a series of transparent photomask substrates having formed therein a series of defects repaired in accord with the present invention.
Figure 7:
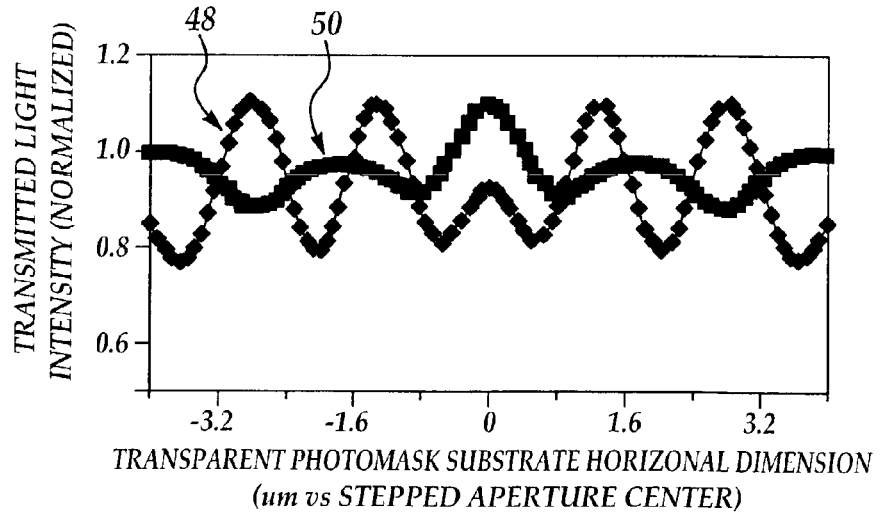

FIG. 6 and FIG. 7 show a pair of graphs of Transmitted Light Intensity versus Transparent Photomask Substrate Horizontal Dimension for a series of repaired transparent photomask substrates in accord with the invention. Within the graphs of FIG. 6 and FIG. 7, each of the series of data points corresponding with a repaired transparent photomask substrate is calculated assuming: (1) a stepped aperture plateau width of 1.0 microns; (2) a transparent photomask substrate formed of quartz; and (3) an actinic photoexposure light source of wavelength 193 or 248 nanometers. Within each of the examples within the graphs of FIG. 6 and FIG. 7, at least either: (1) a number of steps within a series of steps within stepped aperture is changed; and (2) a phase change associated with each of a series of plateaus associated with the series of steps is changed.

Within FIG. 6, reference numeral 40 illustrates a data point curve corresponding with a single step aperture separating a pair of plateaus such as to provide a 180 degree phase change, as otherwise corresponds with the data point curve corresponding with reference numeral 22 within FIG. 2. Reference numeral 42 illustrates a data point curve corresponding with a two step aperture which separates a series of three plateaus which progressively provide zero, 60 and 180 degrees phase change at the series of three plateaus. Reference numeral 44 illustrates a data point curve corresponding with a two step aperture separating a series of three plateaus which progressively provide zero, 120 and 180 degrees phase change at the series of three apertures. Reference numeral 46 illustrates a data point curve corresponding with a two step aperture separating a series of three plateaus which progressively provide zero, 90 and 180 degrees phase change at the series of three plateaus. Finally, reference numeral 48 illustrates a data point curve corresponding with a three step aperture separating a series of four plateaus which progressively provide zero, 60, 120 and 180 degrees phase change at the series of four plateaus.

As is seen from review of the series of data point curves corresponding with reference numerals 40–48 within FIG. 6, an increased number of plateaus and steps which provide equal phase changes within a multi-stepped aperture at the location of a void defect which is eliminated and replaced with the multi-stepped aperture provides for an increased transmitted actinic light intensity within the multi-stepped aperture.

Within FIG. 7, the data point curve which corresponds with reference numeral 48 corresponds with the data point curve which corresponds with reference 48 within FIG. 6. Finally, reference numeral 50 illustrates a data point curve corresponding with a four step aperture separating a series of five plateaus which progressively provide zero, 45, 90, 135 and 180 degrees phase change at the series of five plateaus.

As is illustrated in FIG. 7, this last example provides an actinic transmitted light intensity of from about 90 to about 110 percent (i.e., fairly uniformly) normalized across several microns of transparent photomask substrate which comprises a multi-stepped aperture which may eliminate a defect within a transparent photomask substrate. This fairly uniform actinic transmitted light intensity within a comparatively narrow range of from about 90 to about 110 percent of a normalized value is generally adequate to uniformly photoexpose a blanket photoresist layer while employing a transparent photomask substrate repaired in accord with this last example. For applications where less resolution may be tolerated a transparent photomask substrate repaired with a multi-stepped aperture having a lesser number of steps might adequately alternatively also be employed.

Within the context of the foregoing disclosure, the graphs of FIG. 1, FIG. 6 and FIG. 7 may be determined from data points calculated employing otherwise generally conventional and classical optical diffraction equations.

As is understood by a person skilled in the art, the preferred embodiment of the invention is illustrative of the invention rather than limiting of the invention. Revisions and modifications may be made to methods, materials, structures and dimensions in accord with the preferred embodiment of the invention while still providing a method and a repaired transparent photomask substrate in accord with the invention, further in accord with the accompanying claims.

What is claimed is:

1. A method for repairing a photomask comprising:
   providing a transparent photomask substrate having a defect formed within the transparent photomask substrate; and
   forming into the transparent photomask substrate a multi-stepped aperture which eliminates the defect, the multi-stepped aperture having a series of progressive steps which separate a series of progressive plateaus, each plateau having a plateau width and step height such as to enhance transparent photomask substrate transmittance within the multi-stepped aperture.

2. The method of claim 1 wherein the transparent photomask substrate is formed of quartz.

3. The method of claim 1 wherein the transparent photomask substrate is one of a blank transparent photomask substrate and a fabricated transparent photomask substrate.

4. The method of claim 1 wherein the defect is one of a protrusion defect and a void defect.

5. The method of claim 1 wherein the series of progressive steps comprises at least two steps and the series of progressive plateaus comprises at least three plateaus.

6. The method of claim 1 wherein the series of progressive steps comprises at least three steps and the series of progressive plateaus comprises at least four plateaus.

7. The method of claim 1 wherein the multi-stepped aperture has a plateau that provides a 180 degree phase change of radiation passing through the multi-stepped aperture.

8. A method for repairing a photomask comprising:
   providing a transparent photomask substrate having a defect formed within the transparent photomask substrate; and
   forming into the transparent photomask substrate a multi-stepped aperture which eliminates the defect, the multi-stepped aperture having a series of at least four progressive steps which separate a series of at least five progressive plateaus, each plateau having a plateau width and step height such as to enhance transparent photomask substrate transmittance within the multi-stepped aperture.

9. The method of claim 8 wherein the transparent photomask substrate is formed of quartz.

10. The method of claim 8 wherein the transparent photomask substrate is one of a blank transparent photomask substrate and a fabricated transparent photomask substrate.

11. The method of claim 8 wherein the defect is one of a protrusion defect and a void defect.

12. The method of claim 8 wherein the series of at least five progressive plateaus is a series of five plateaus providing a series of phase changes of zero, 45, 90, 135 and 180 degrees.

13. The method of claim 8 wherein the multi-stepped aperture has a plateau that provides a 180 degree phase change of radiation passing through the multi-stepped aperture.

14. A repaired photomask comprising:
   a transparent photomask substrate having formed therein a multi-stepped aperture having a series of progressive steps which separate a series of progressive plateaus, each plateau having a plateau width and step height such as to enhance transparent photomask substrate transmittance within the multi-stepped aperture.

15. The repaired photomask of claim 14 wherein the series of progressive steps comprises at least two steps and the series of progressive plateaus comprises at least three plateaus.

16. The repaired photomask of claim 14 wherein the series of progressive steps comprises at least three steps and the series of progressive plateaus comprises at least four plateaus.

17. The repaired photomask of claim 14 wherein the series of progressive steps comprises at least four steps and the series of progressive plateaus comprises at least five plateaus.

18. The repaired photomask of claim 14 wherein the series of progressive steps comprises four steps and the series of progressive plateaus comprises five plateaus providing a progressive series of phase changes of zero, 45, 90, 135 and 180 degrees.

19. The repaired photomask of claim 14 wherein the multi-stepped aperture has a plateau that provides a 180 degree phase shift of radiation passing through the multi-stepped aperture.

* * * * *